United States Patent
Kang et al.

(10) Patent No.: US 12,272,640 B2
(45) Date of Patent: Apr. 8, 2025

(54) SEMICONDUCTOR DEVICE WITH SOURCE RESISTOR

(71) Applicant: TAIWAN SEMICONDUCTOR MANUFACTURING CO., LTD., Hsinchu (TW)

(72) Inventors: Po-Zeng Kang, Tainan (TW); Wen-Shen Chou, Hsinchu County (TW); Yung-Chow Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 88 days.

(21) Appl. No.: 18/304,261

(22) Filed: Apr. 20, 2023

(65) Prior Publication Data

US 2023/0260902 A1    Aug. 17, 2023

Related U.S. Application Data

(60) Continuation of application No. 17/567,786, filed on Jan. 3, 2022, now Pat. No. 11,670,586, which is a
(Continued)

(51) Int. Cl.
*H01L 21/00* (2006.01)
*H01L 21/768* (2006.01)
(Continued)

(52) U.S. Cl.
CPC .... *H01L 23/5228* (2013.01); *H01L 21/76895* (2013.01); *H01L 23/535* (2013.01); *H01L 27/0629* (2013.01); *H01L 28/24* (2013.01)

(58) Field of Classification Search
CPC ........... H01L 23/5228; H01L 21/76895; H01L 23/535
See application file for complete search history.

(56) References Cited

U.S. PATENT DOCUMENTS

| 4,541,006 A | 9/1985 | Ariizumi et al. |
| 4,618,875 A | 10/1986 | Flohrs |

(Continued)

FOREIGN PATENT DOCUMENTS

| CN | 1337745 A | 2/2002 |
| CN | 1725490 A | 1/2006 |

(Continued)

OTHER PUBLICATIONS

Marcel. J. M. Pelgrom et al., "Matching properties of MOS transistors," IEEE Journal of Solid-State Circuits, vol. 24, No. 5, Oct. 1989, pp. 1433-1440.

(Continued)

*Primary Examiner* — Laura M Menz
(74) *Attorney, Agent, or Firm* — Maschoff Brennan

(57) ABSTRACT

A semiconductor device includes a plurality of transistors, a plurality of metal layers, and a resistor. The plurality of transistors are connected in series between a power terminal and a ground terminal, and gate terminals of the transistors being connected together. The plurality of metal layers are overlaid above the plurality of transistors. The resistor is implemented between two of the plurality of metal layers.

20 Claims, 9 Drawing Sheets

Related U.S. Application Data division of application No. 16/796,668, filed on Feb. 20, 2020, now Pat. No. 11,217,526.

(60) Provisional application No. 62/812,181, filed on Feb. 28, 2019.

(51) Int. Cl.
  *H01L 23/522* (2006.01)
  *H01L 23/535* (2006.01)
  *H01L 27/06* (2006.01)
  *H01L 49/02* (2006.01)

(56) References Cited

U.S. PATENT DOCUMENTS

| | | | | |
|---|---|---|---|---|
| 4,939,485 | A * | 7/1990 | Eisenberg | H03K 17/6871 257/280 |
| 6,490,918 | B2 | 12/2002 | Lang | |
| 7,564,295 | B2 * | 7/2009 | Ker | G11C 17/18 327/51 |
| 8,080,461 | B2 | 12/2011 | Yeh et al. | |
| 8,587,992 | B2 * | 11/2013 | Chen | G11C 11/413 365/189.011 |
| 8,719,759 | B1 | 5/2014 | Chou et al. | |
| 9,093,530 | B2 | 7/2015 | Huang et al. | |
| 9,171,929 | B2 | 10/2015 | Lee et al. | |
| 9,214,555 | B2 | 12/2015 | Oxland et al. | |
| 9,236,267 | B2 | 1/2016 | De et al. | |
| 9,306,495 | B2 * | 4/2016 | Chen | H03B 5/36 |
| 9,406,770 | B2 * | 8/2016 | Song | H01L 21/76895 |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 9,608,616 | B1 * | 3/2017 | Tsai | H03K 19/00315 |
| 9,634,659 | B2 * | 4/2017 | Jin | H02H 9/043 |
| 9,941,267 | B2 * | 4/2018 | Tsai | H01L 27/0266 |
| 10,931,103 | B2 * | 2/2021 | Chen | H01L 27/0266 |
| 11,215,513 | B2 * | 1/2022 | Kang | H01L 27/0924 |
| 11,217,526 | B2 * | 1/2022 | Kang | H01L 23/5228 |
| 11,329,659 | B2 * | 5/2022 | Kinyua | H03M 1/0602 |
| 11,606,089 | B2 * | 3/2023 | Liu | H01L 27/0629 |
| 11,670,586 | B2 * | 6/2023 | Kang | G05F 3/262 257/379 |
| 11,695,007 | B2 * | 7/2023 | Wang | H01L 27/0207 327/109 |
| 11,855,644 | B2 * | 12/2023 | Hsieh | H03K 5/133 |
| 12,021,078 | B2 * | 6/2024 | Jin | H01L 29/4238 |
| 12,100,655 | B2 * | 9/2024 | Yang | H01L 21/32135 |
| 12,119,815 | B2 * | 10/2024 | Chen | H03K 19/20 |
| 12,132,081 | B2 * | 10/2024 | Horng | H01L 27/088 |
| 12,132,477 | B2 * | 10/2024 | Chen | H03K 17/6874 |
| 2001/0050410 | A1 * | 12/2001 | Aswell | H01L 27/0802 257/E27.047 |
| 2002/0020879 | A1 * | 2/2002 | Shiiki | H01L 27/0802 257/E27.047 |
| 2002/0048830 | A1 * | 4/2002 | Murayama | G01R 31/27 438/18 |
| 2002/0084492 | A1 | 7/2002 | Osanai et al. | |
| 2005/0258864 | A1 * | 11/2005 | Chen | H03K 17/102 326/81 |
| 2006/0250734 | A1 * | 11/2006 | Kato | H01L 27/0266 361/56 |
| 2007/0252213 | A1 * | 11/2007 | Hirose | G05F 3/262 257/E27.111 |
| 2009/0115774 | A1 | 5/2009 | Chuang et al. | |
| 2012/0261747 | A1 | 10/2012 | Park et al. | |
| 2014/0084994 | A1 | 3/2014 | Merkin et al. | |
| 2014/0119104 | A1 * | 5/2014 | Chen | G11C 11/417 365/156 |
| 2014/0266419 | A1 * | 9/2014 | Jin | H03K 17/693 327/581 |
| 2015/0016198 | A1 * | 1/2015 | Wu | H03K 3/35613 327/333 |
| 2015/0171860 | A1 * | 6/2015 | Blin | H03K 17/102 438/275 |
| 2016/0020148 | A1 * | 1/2016 | Song | H01L 23/5228 438/238 |
| 2016/0276425 | A1 * | 9/2016 | Saito | H01L 27/0629 |
| 2016/0307887 | A1 * | 10/2016 | Song | H01L 21/76897 |
| 2018/0026029 | A1 * | 1/2018 | Lin | H01L 28/20 361/56 |
| 2019/0097420 | A1 * | 3/2019 | Chen | H01L 27/0285 |
| 2020/0279809 | A1 * | 9/2020 | Kang | H01L 23/535 |
| 2021/0116308 | A1 * | 4/2021 | Kang | H01L 29/785 |
| 2021/0305248 | A1 * | 9/2021 | Wang | H01L 27/0207 |
| 2021/0408120 | A1 * | 12/2021 | Lin | H01L 29/7869 |
| 2022/0037312 | A1 * | 2/2022 | Kang | H01L 28/24 |
| 2022/0122913 | A1 * | 4/2022 | Kang | H01L 23/5228 |
| 2022/0223579 | A1 * | 7/2022 | Chang | H03K 17/102 |
| 2022/0254811 | A1 * | 8/2022 | Iida | H01L 27/11807 |
| 2023/0155583 | A1 * | 5/2023 | Hsieh | H03K 5/14 327/158 |
| 2023/0178605 | A1 * | 6/2023 | Horng | H01L 29/401 257/288 |
| 2023/0231554 | A1 * | 7/2023 | Liu | H03K 17/6871 327/552 |
| 2023/0238956 | A1 * | 7/2023 | Chen | H03K 3/012 327/205 |
| 2023/0258721 | A1 * | 8/2023 | Yang | G01R 31/31922 714/744 |
| 2023/0260902 | A1 * | 8/2023 | Kang | H01L 21/76895 257/379 |
| 2023/0275043 | A1 * | 8/2023 | Yang | H01L 23/642 257/532 |
| 2023/0343785 | A1 * | 10/2023 | Wang | H03K 17/6872 |
| 2023/0358618 | A1 * | 11/2023 | Horng | G01K 7/16 |
| 2023/0378054 | A1 * | 11/2023 | Chen | H01L 23/5226 |
| 2023/0378060 | A1 * | 11/2023 | Yang | H01L 21/32135 |
| 2023/0402452 | A1 * | 12/2023 | Kang | H03K 19/09441 |
| 2024/0014136 | A1 * | 1/2024 | Syu | H01L 23/5226 |
| 2024/0088842 | A1 * | 3/2024 | Liang | H01L 27/0629 |
| 2024/0088892 | A1 * | 3/2024 | Chen | H03K 19/018521 |
| 2024/0106425 | A1 * | 3/2024 | Hsieh | H03K 5/2481 |
| 2024/0159599 | A1 * | 5/2024 | Kang | H01L 23/5226 |
| 2024/0186989 | A1 * | 6/2024 | Chen | H03K 19/018521 |
| 2024/0379757 | A1 * | 11/2024 | Horng | H01L 27/088 |

FOREIGN PATENT DOCUMENTS

| | | | | |
|---|---|---|---|---|
| CN | 101064496 A | | 10/2007 | |
| CN | 101430573 A | | 5/2009 | |
| CN | 111627906 A | * | 9/2020 | G05F 3/262 |
| DE | 102020104809 A1 | * | 9/2020 | G05F 3/262 |
| DE | 102021102951 A1 | * | 1/2022 | H01L 27/06 |
| JP | H02130951 A | | 5/1990 | |
| JP | 2002124639 A | * | 4/2002 | H01L 27/0802 |
| JP | 2006313814 A | * | 11/2016 | H01L 27/0266 |
| JP | 7415183 B2 | * | 1/2024 | H01L 27/0207 |
| KR | 20020013451 A | | 2/2002 | |
| KR | 10-2005-0080328 A | | 8/2005 | |
| KR | 20070106459 A | | 11/2007 | |
| KR | 20-2001-05626 A | | 9/2020 | |
| TW | 200921910 A | | 5/2009 | |
| WO | WO-2021090471 A1 | * | 5/2021 | H01L 27/0207 |

OTHER PUBLICATIONS

Wei-Hsin Tseng et al., "A 960MS/s DAC with 80dB SFDR in 20nm CMOS for Multi-Mode Baseband Wireless Transmitter", 2014 Symposium on VLSI Circuits Digest of Technical Papers.

Alvin L. S. Loke et al., "Analog/Mixed-signal design challenges in 7-nm CMOS and beyond" 2018 IEEE.

* cited by examiner

SEMICONDUCTOR DEVICE WITH SOURCE RESISTOR

CROSS-REFERENCE TO RELATED APPLICATION

This application is a continuation of U.S. application Ser. No. 17/567,786, filed Jan. 3, 2022, which is a divisional application of U.S. application Ser. No. 16/796,668, filed Feb. 20, 2020 (Now U.S. Pat. No. 11,217,526 issued on Jan. 4, 2022), which claims priority to U.S. Provisional Application Ser. No. 62/812,181, filed Feb. 28, 2019, which is herein incorporated by reference.

BACKGROUND

As semiconductor technologies evolve, integrated circuits (IC) have migrated to small feature sizes, such as 8 nanometers, 16 nanometers, 12 nanometers, 7 nanometers, 5 nanometers and below. Semiconductor technologies with small feature sizes lead to more interactions between semiconductor fabrication and design. The impact of manufacturing variations will become more important for semiconductor devices. For example, when two transistors with identical design are manufactured, the manufacturing variations existed between these two transistors will cause a mismatch between these two transistor. Such variations may cause a shift of the ratio between two semiconductor resistors. As such, some critical performance indexes such as timing, noise and reliability may be negatively affected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
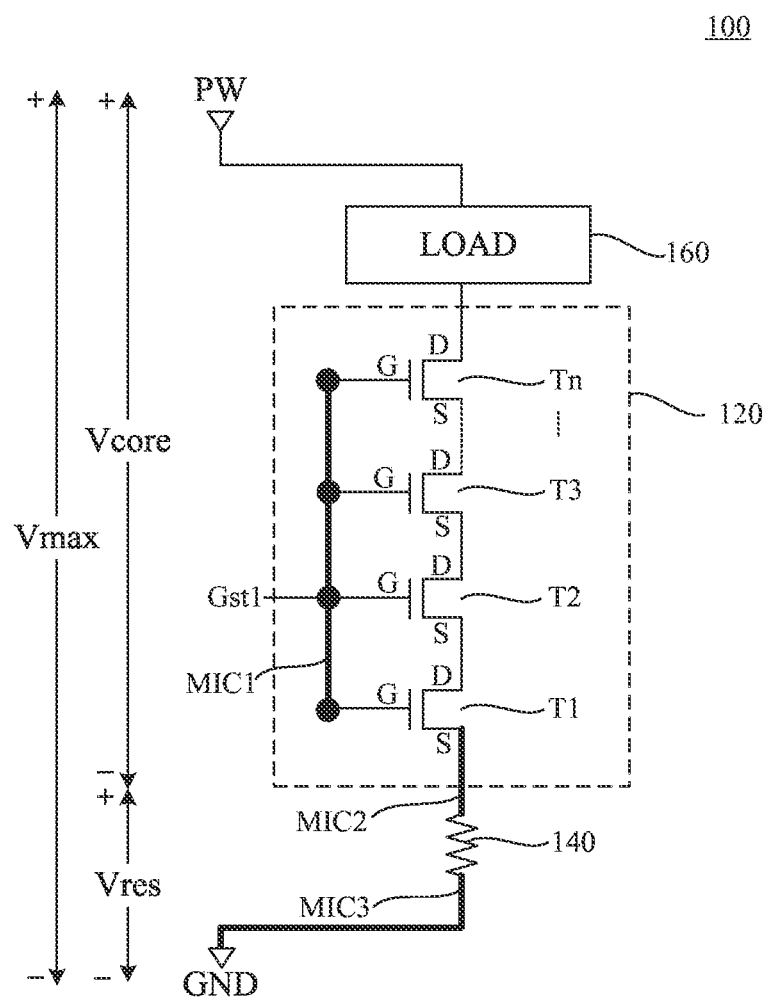
FIG. 1 is an exemplary layout diagram of a semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Semiconductor technologies with small feature sizes lead to more interactions between semiconductor fabrication and design. For example, when a transistor is manufactured, the manufacturing variations on the transistor may cause a shift of some critical performance indexes such as parasitic resistance, timing, noise and reliability. If the parasitic resistance of the transistor is shifted according to the manufacturing variations, an operating current flowing through the transistor will vary dramatically. Some embodiments in this disclosure include a source resistor connected between a source terminal of a transistor and a ground terminal, and the source resistor can be utilized to suppress or reduce a variation of the operating current induced by variations of the transistor.

FIG. 1 is an exemplary layout diagram of a semiconductor device in accordance with various embodiments of the present disclosure. As illustratively shown in FIG. 1, the semiconductor device 100 includes a transistor group 120 (including transistors T1, T2, T3 . . . Tn), a resistor 140 and a load 160. In some embodiments, n is a positive integer lager than or equal to 3. The number of the transistors T1~Tn in the semiconductor device 100 in FIG. 1 is given for illustrative purposes. Various numbers of the transistors T1~Tn are within the contemplated scope of the present disclosure.

Examples of transistors T1~Tn include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, or planar MOS transistors with raised source/drains. The transistors T1~Tn, illustratively shown in FIG. 1, are the metal oxide semiconductor field effect transistors (MOSFETs) for illustrative purposes. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As illustratively shown in FIG. 1, the transistors T1, T2, T3 . . . Tn in the transistor group 120 are connected in series between a power terminal PW and a ground terminal GND. For example, a source terminal S of the transistor T1 is connected to the ground terminal GND via the resistor 140; a drain terminal D of the transistor T1 is connected to a source terminal S of the transistor T2; a drain terminal D of the transistor T2 is connected to a source terminal S of the transistor T3; a drain terminal D of the transistor T3 is connected a source terminal S of a following transistor (not shown in FIG. 1), and so on. At the other end of the transistors T1~Tn connected in series, a drain terminal D of the transistor Tn is connected to the power terminal PW via the load 160.

As illustratively shown in FIG. 1, gate terminals of the transistors T1~Tn are connected together by a first metal interconnect MIC1. The gate terminals of the transistors T1~Tn in the transistor group 120 are stacked together as a stacked gate terminal Gst1. The transistors T1~Tn in the transistor group 120 connected in series will be turned on or turned off together by a voltage level on the stacked gate Gst1. Therefore, the transistors T1~Tn in the transistor group 120 can function as one equivalent transistor. The first metal interconnect MIC1 is located in one of metal layers, such as the first metal layer (M1), the second metal layer (M2), the third metal layer (M3), the fourth metal layer (M4), the fifth metal layer (M5) or the like, overlaid above the transistor group 120.

In some embodiments, each of the transistors T1~Tn in the transistor group 120 has a similar size or about the same size. In some embodiment, each of the transistors T1~Tn in the transistor group 120 has a gate length in a ranged from about 1 unit of minimum gate length to about 5 units of minimum gate length according to a manufacturing process standard. If each of the transistors T1~Tn in the transistor group 120 has the gate length longer than 5 units of minimum gate length, a total size occupied by the transistor group 120 will be too big.

As illustratively shown in FIG. 1, the resistor 140 is connected between the transistor group 120 and the ground terminal GND. More particularly, a first end of the resistor 140 is connected to a source terminal of the transistor T1 by a second metal interconnect MIC2, and a second end of the resistor 140 is connected to the ground terminal GND by a third metal interconnect MIC3. The second metal interconnect MIC2 and the third metal interconnect MIC3 are located on at least one of metal layers, such as the first metal layer (M1), the second metal layer (M2), the third metal layer (M3), the fourth metal layer (M4), the fifth metal layer (M5) or the like, overlaid above the transistor group 120.

Figure 2:
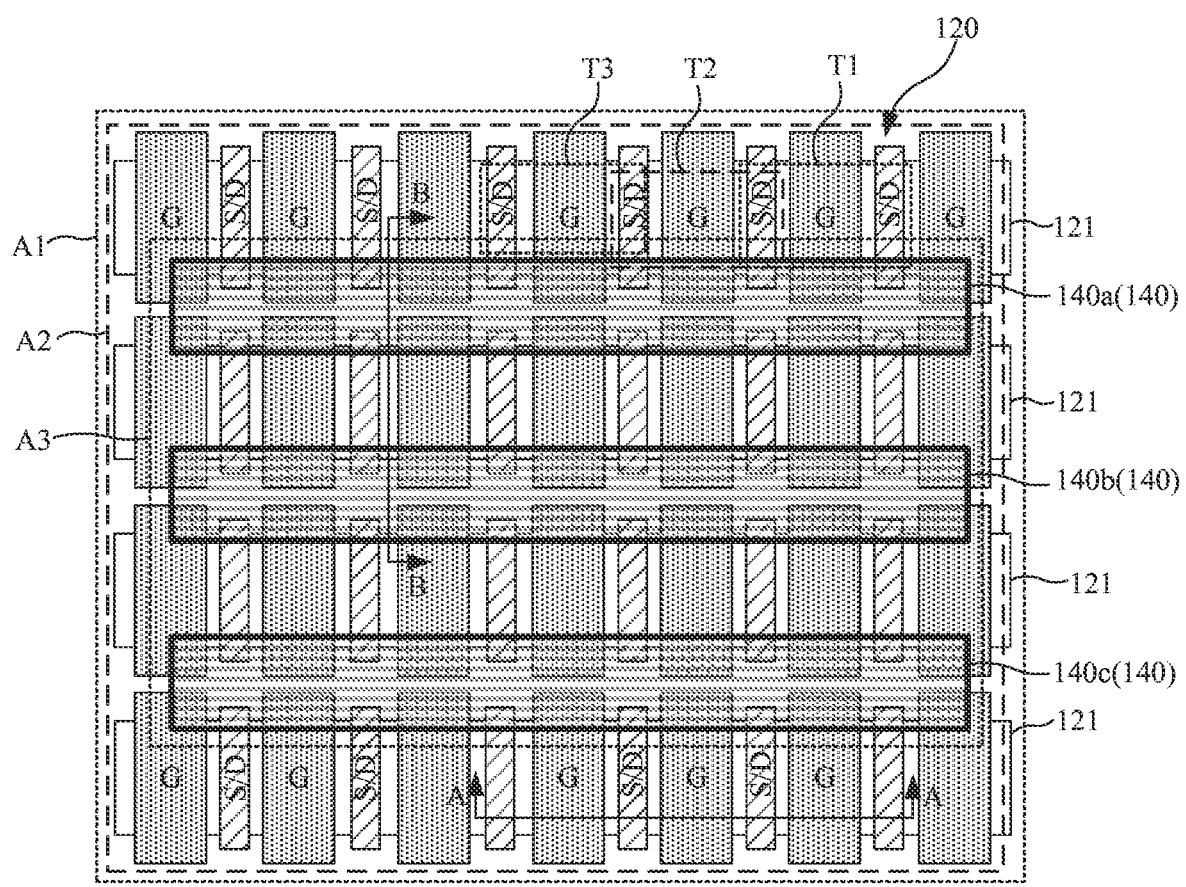
FIG. 2 is a top view diagram illustrating a structure of the transistor group and the resistor in the semiconductor device in accordance with some embodiments.

FIG. 2 is a top view diagram illustrating a structure of the transistor group 120 and the resistor 140 in the semiconductor device 100 in accordance with some embodiments. With respect to the embodiments of FIG. 1, like elements in FIG. 2 are designated with the same reference numbers for ease of understanding.

For simplicity, three transistors T1, T2 and T3 of the transistor group 120 are labelled in FIG. 2. As embodiments illustratively shown in FIG. 2, the transistors T1 and T2 are implemented adjacent to each other on a continuous active region 121, and the transistors T2 and T3 are implemented adjacent to each other on the continuous active region 121. Similarly, other transistors (e.g. Tn) of the transistor group 120 can be implemented in similar manner.

Figure 3:
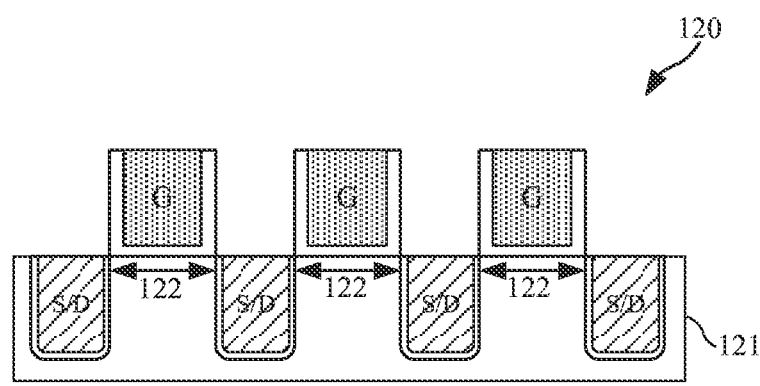
FIG. 3 is a sectional view diagram along a sectional line of the transistor group in FIG. 2 according to some embodiments of the present disclosure.

FIG. 3 is a sectional view diagram, along the "A-A" line, of the transistor group 120 in FIG. 2, according to some embodiments of the present disclosure. With respect to the embodiments of FIG. 1 and FIG. 2, like elements in FIG. 3 are designated with the same reference numbers for ease of understanding. As illustratively shown in FIG. 3, the transistor group 120 includes source/drain regions (S/D) disposed in the continuous active region 121 and gate electrodes (G) disposed on a top surface of the continuous active region 121. Each of the gate electrodes (G) are located above a channel 122 between two adjacent source/drain regions (S/D).

In some embodiments, the gate electrodes (G) of the transistors in the transistor group 120 are implemented by doped polysilicon gates or high dielectric constant (HiK) metal gates. In some embodiments, a gate pattern density of each of the doped polysilicon gates or the HiK metal gates is about 5% to about 30%. If the gate pattern density is lower than 5%, an area utilization efficiency in placing the gate pattern will be low, and the same gate pattern will occupy a larger area. If the gate pattern density is lower than 30%, two adjacent gate patterns will be too close to each other, and these two gate pattern may have interference issues. In some embodiments, all regions/objects of the transistors in the transistor group 120 are limited to have about 1% to about 15% tolerance gap of density within an about 2 um to 10 um square searching/checking window. The tolerance gap of density and the size of the searching/checking window are dependent to manufacturing process of the semiconductor device 100. If the size of the searching/checking window is smaller than 2 um, it will cost a lot of time in checking the semiconductor device 100. If the size of the searching/checking window is larger than 10 um, an effect of average may happen (e.g., an over density block and an under density block may combined to be qualified blocks) and the searching/checking window may contain too many polygons or blocks.

In some embodiments, each of the transistors T1~Tn in the transistor group 120 in FIG. 1 has a gate length L (i.e., the gate length L equals to a length of one channel 122 shown in FIG. 3), and the equivalent transistor formed by the transistor group 120 in FIG. 1 may have an equivalent gate length equals to n*L. In other words, the transistors T1~Tn are stacked together in the transistor group 120 to form the equivalent transistor with an equivalent gate length n*L, which is n times as long as the gate length L of each one of the transistors T1~Tn. In some cases, one transistor with a long gate length (e.g., n*L) requires control signals with a relatively high voltage level. In the embodiments illustrated in FIG. 1, each of the transistors T1~Tn with the gate length L is able to be controlled by a relatively low voltage level (compared to one transistor with the long gate length).

The resistor 140 is disposed above the transistor group 120. The resistor 140 includes at least one piece of thin film resistors. As embodiments illustratively shown in FIG. 2, the resistor 140 includes three pieces of thin film resistors 140*a*, 140*b* and 140*c*. The number of the thin film resistors 140*a*~140*c* in the resistor 140 in FIG. 2 is given for illustrative purposes. Various numbers of the thin film resistors 140*a*~140*c* are within the contemplated scope of the present disclosure. Each of the thin film resistors 140*a*~140*c* are thin film resistor material formed over the transistor group 120. In some embodiments, each of the thin film resistors 140*a*~140*c* can be a titanium nitride (TiN) thin film resistor, and the titanium nitride (TiN) thin film resistor are manufacture-able in very-large-scale integration (VLSI) process with low variation and/or high accuracy. In other embodiments, the thin film resistors 140*a*~140*c* may be formed of other film resistor materials such as: nickel chrome (Ni—Cr) or other resistor materials.

FIG. 4A, FIG. 4B, FIG. 4C and FIG. 4D are sectional view diagrams, along the "B-B" line, of the transistor group 120 and the thin film resistors 140*a*~140*b* of the resistor 140 in FIG. 2, according to some embodiments of the present disclosure. With respect to the embodiments of FIG. 1 and FIG. 2, like elements in FIG. 4A to FIG. 4D are designated with the same reference numbers for ease of understanding.

As illustratively shown in FIG. 4A to FIG. 4D, there are k different layers of metal layers ML1, ML2, ML3, . . . and MLk overlaid above the transistor group 120. It is noticed that, k is a positive integer. Various numbers of the metal layers are within the contemplated scope of the present disclosure. The first metal interconnect MIC1, the second metal interconnect MIC2 and the third metal interconnect MIC3 in FIG. 1 are located on at least one of metal layers ML1, ML2, ML3, . . . and MLk shown in FIG. 4A to FIG. 4D.

As illustratively shown in FIG. 4A to FIG. 4D, there are a top metal layer TML and a bond pad layer APL located above the metal layers ML1~MLk. In some embodiments, the top metal layer TML is overlaid over the top of the metal layer MLk for protecting the metal layers below. The bond pad layer APL is overlaid over the top metal layer TML. In some embodiments, the bond pad layer APL is utilized to bond or connect with a connecting pin (not shown in figures) outside the semiconductor device 100.

Figure 4A:
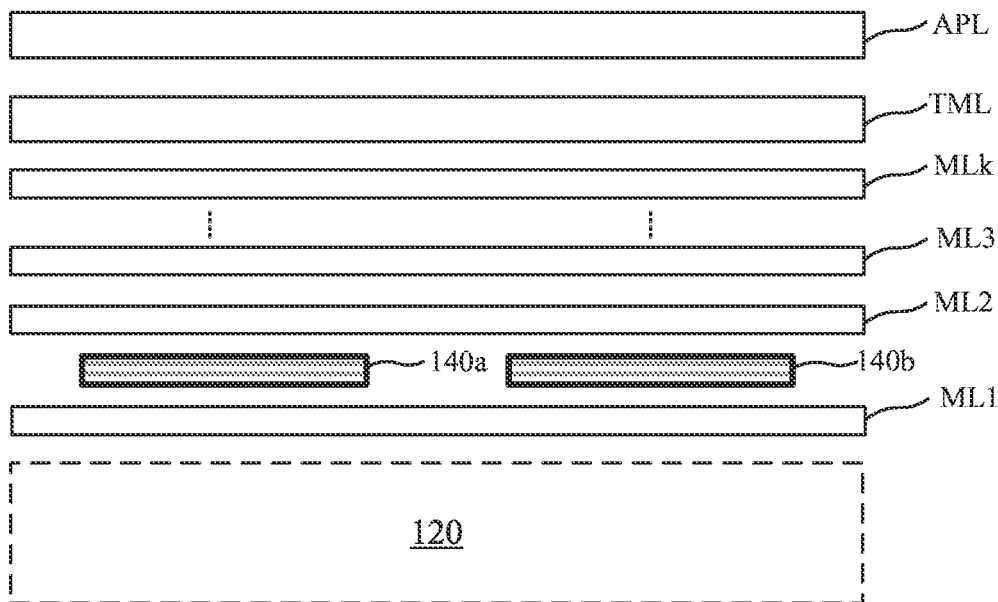
FIG. 4A, FIG. 4B, FIG. 4C and FIG. 4D are sectional view diagrams along another sectional line of the transistor group and the thin film resistors of the resistor in FIG. 2 according to some embodiments of the present disclosure.

As embodiments illustratively shown in FIG. 4A, the thin film resistors 140*a*~140*b* of the resistor 140 are overlaid above the transistor group 120 and located between the first metal layer ML1 and the second metal layer ML2.

Figure 4B:
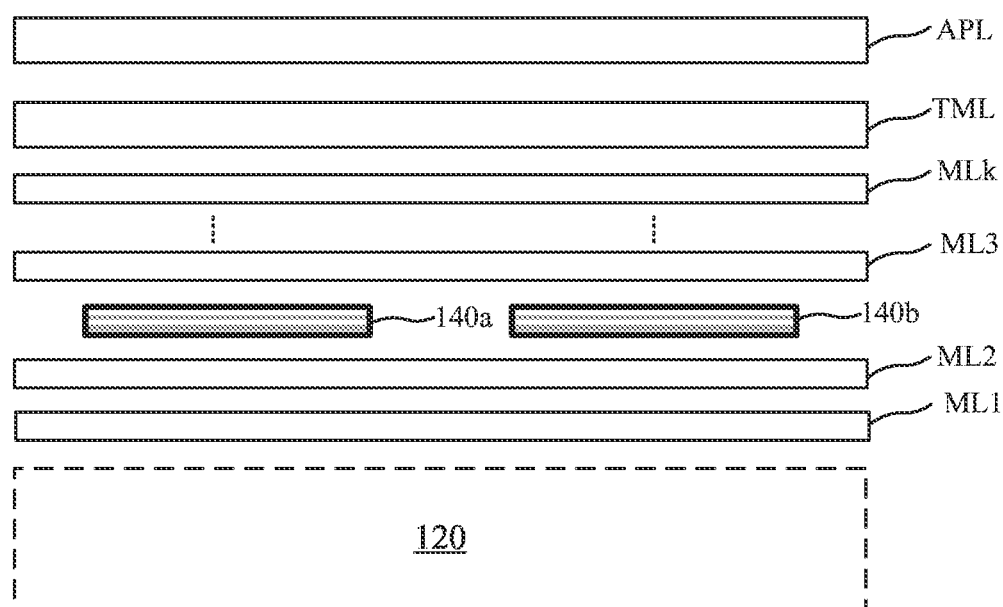

As other embodiments illustratively shown in FIG. 4B, the thin film resistors 140*a*~140*b* of the resistor 140 are overlaid above the transistor group 120 and located between the second metal layer ML2 and the third metal layer ML3.

Similarly, the thin film resistors 140*a*~140*b* of the resistor 140 can be located between two adjacent layers of the metal layers ML1~MLk. Various locations of the resistor 140 are within the contemplated scope of the present disclosure.

Figure 4C:
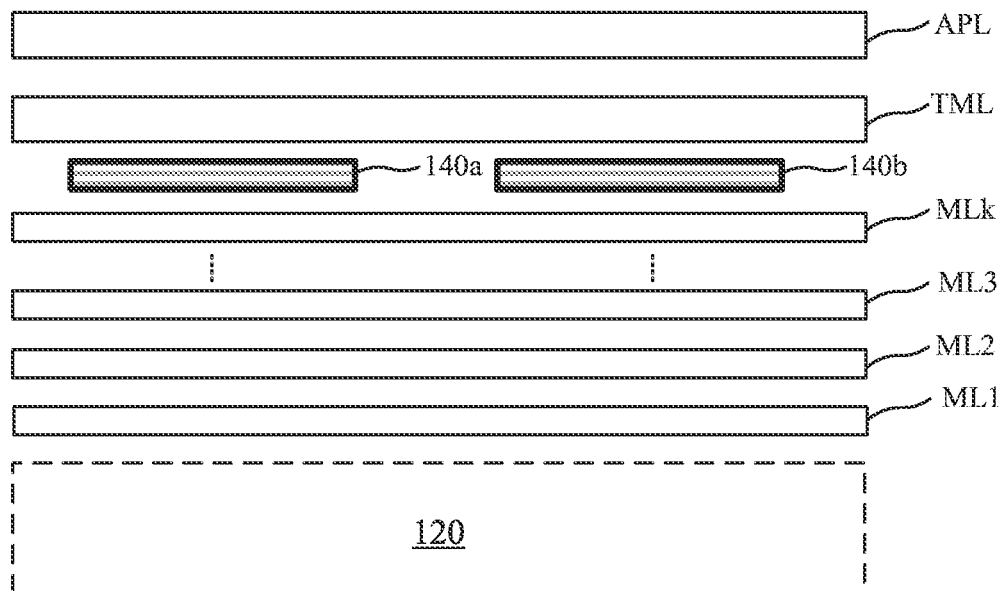

As other embodiments illustratively shown in FIG. 4C, the thin film resistors 140*a*~140*b* of the resistor 140 are overlaid above the transistor group 120 and located between the k-th metal layer MLk and the top metal layer TML.

Figure 4D:
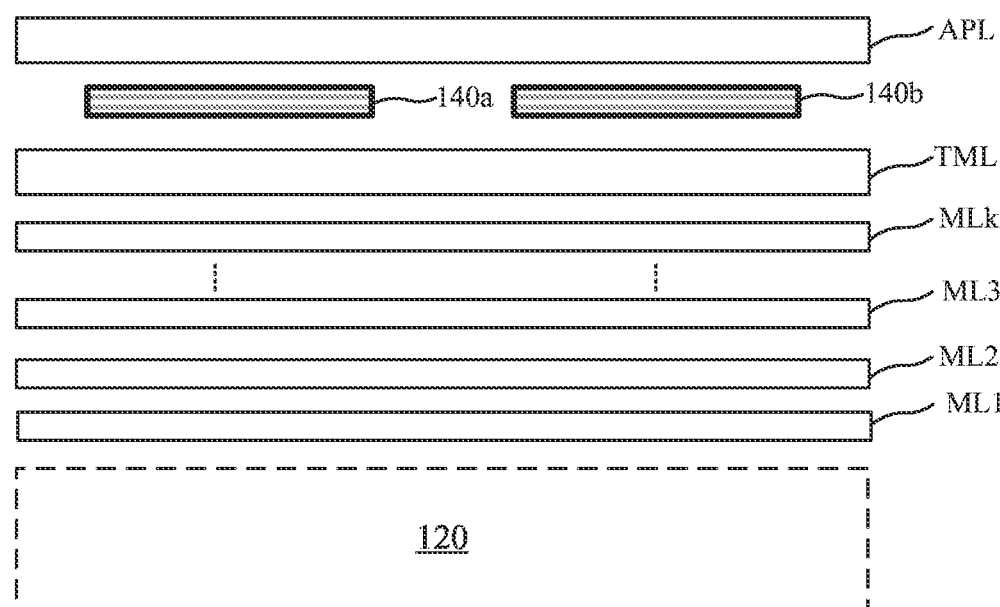

As other embodiments illustratively shown in FIG. 4D, the thin film resistors 140*a*~140*b* of the resistor 140 are overlaid above the transistor group 120 and located between the top metal layer TML and the bond pad layer APL.

In other words, the resistor 140 overlaid above the transistor group 120 can be located between any two adjacent layers selected from the metal layers ML1~MLk, the top metal layer TML and the bond pad layer APL.

As illustratively shown in FIG. 2, the transistors in the transistors group 120 are implemented in a first area A1. The first metal interconnect MIC1, the second metal interconnect MIC2 and the metal interconnect MIC3 in FIG. 1 are implemented in a second area A2 in FIG. 2. The thin film resistors 140*a*~140*c* of the resistor 140 are implemented in a third area A3 in FIG. 2. In some embodiments, as illustratively shown in FIG. 2, a size of the second area A2 can be similar to a size of the first area A1, and a size of the third area A3 can be smaller than the sizes of the first area A1 and the second area A2. If the third area A3 where the resistor 140 locates is larger than the first area A1 of the transistor group 120, the resistor 140 will affect other active components (not shown in figures) located nearby. As shown in FIG. 2 and FIG. 4A to FIG. 4D, the resistor 140 is disposed above the transistor group 120, such that the resistor 140 will not occupy extra area outside the first area A1 (for accommodating the transistors group 120) on a layout of the semiconductor device. The third area A3 for accommodating the resistor 140 totally overlaps with the first area A1 for accommodating the transistors group 120. In other words, forming the resistor 140 overlaid over the transistors group 120 can reduce a consumption of area resource in the layout design.

At Chemical-Mechanical Planarization (CMP) process, the pattern density is a critical factor to achieve flatness and properties for a layer itself as well as other layers of above. In some embodiments, the third area A3 of resistor 140 is smaller or enclosed by the second area A2 of the metal interconnects MIC1~MIC3 and also the second area A2 is smaller or enclosed by the first area A1 of the transistors group 120, such that a flatness of pattern density of under layers can ensure a flatness of pattern density of upper layers. Otherwise, the different pattern densities on the transistor layer corresponding to the transistors group 120 will cause different thicknesses on the transistor layer; different pattern densities on the metal layers corresponding to the metal interconnects MIC1~MIC3 will cause different thicknesses on the metal layers; and different pattern densities on the resistor layer corresponding to the resistor 140 will make different thickness on the resistor layer. If the resistor 140 is implemented above the second area A2 or the third area A3 with different pattern densities and different thicknesses, the height of the resistor layer may not be constant, and the resistance of the resistor 140 may be varied because of the uneven thicknesses of two areas A2 and A3.

Figure 5A:
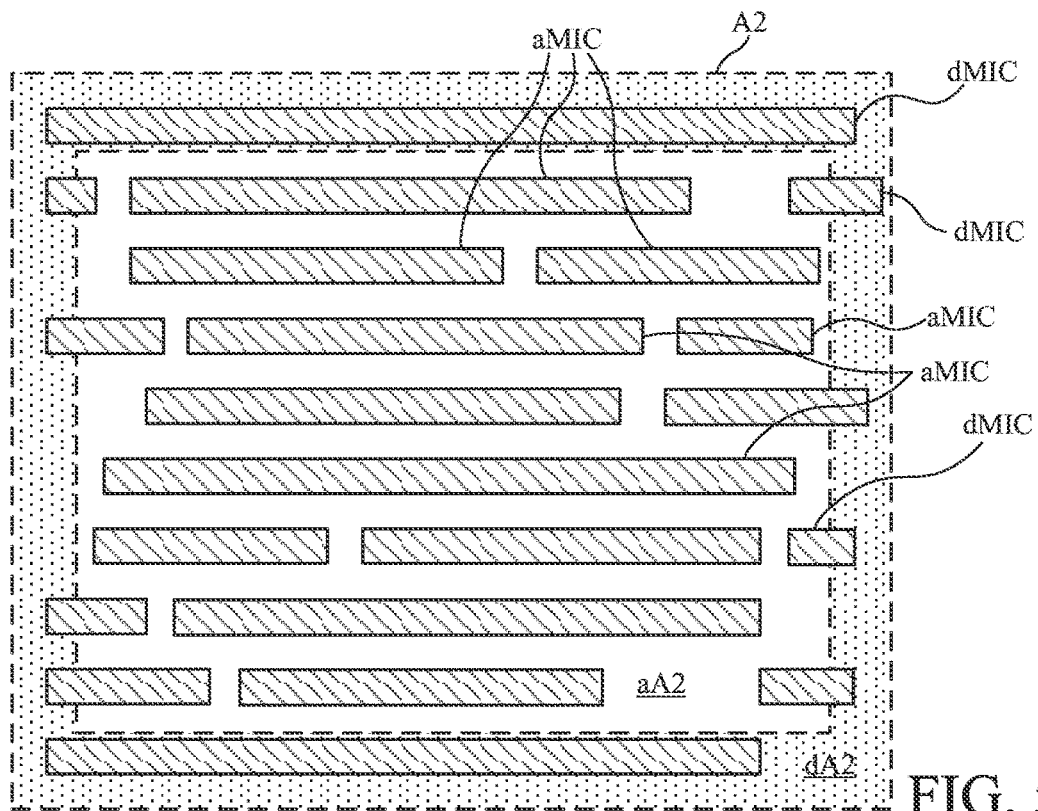
FIG. 5A is a top view diagram illustrating metal interconnects in the second area in FIG. 2 in accordance with some embodiments.

FIG. 5A is a top view diagram illustrating metal interconnects in the second area A2 in FIG. 2 in accordance with some embodiments. With respect to the embodiments of FIG. 2, like elements in FIG. 5A are designated with the same reference numbers for ease of understanding.

As illustratively shown in FIG. 5A, the second area A2 include an active region aA2 and an inactive region dA2. The inactive region dA2 locates around four boundary edges of the second area A2 and surrounds the active region aA2. There are several metal interconnects (including active metal interconnects aMIC and dummy metal interconnects dMIC) formed in the second area A2. As illustratively shown in FIG. 5A, metal interconnects in the active region aA2 are the active metal interconnects aMIC. The active metal interconnects aMIC in FIG. 5A are utilized to implement the first metal interconnect MIC1 (for connecting the gate terminals of the transistor T1~Tn together in FIG. 1), the second metal interconnect MIC2 (for connecting the source terminal of the transistor T1 to the resistor 140 in FIG. 1) and the third metal interconnect MIC3 (for connecting the resistor 140 to the ground terminal GND in FIG. 1) as the embodiments illustrated in FIG. 1. The dummy metal interconnects dMIC located at least a part in the inactive region dA2 are not utilized to form the first metal interconnect MIC1, the second metal interconnect MIC2 or the third metal interconnect MIC3 in FIG. 1. In some embodiments, the dummy metal interconnects dMIC are implemented to ensure flatness on the layer where the metal interconnects locate.

In the embodiments illustratively shown in FIG. 5A, the active metal interconnects aMIC and the dummy metal interconnects dMIC are disposed along a horizontal direction. In some embodiments, a width of each of the active metal interconnects aMIC and the dummy metal interconnects dMIC is about 1 unit of minimum line width to about 2 units of minimum line width according to a manufacturing process standard. Due to modern metal/interconnect process, metal routes with minimum feature width (e.g., 1 or 2 units of minimum line width) will have better properties, such as lower resistances on the metal routes or lower variations of resistances on the metal routes. In some embodiments, a metal density of each of the active metal interconnects aMIC and the dummy metal interconnects dMIC is about 15% to about 50%. Due to modern metal/interconnect process, aforesaid metal density of the active metal interconnects aMIC and the dummy metal interconnects dMIC will induce better properties, such as lower resistances on the metal interconnects and lower variations of resistances on the metal interconnects. In some embodiments, all objects of the active metal interconnects aMIC and the dummy metal interconnects dMIC are limited to have about 1% to about 15% tolerance gap within a searching/checking window. In some embodiment, a size of the searching/checking window can about about 2 um to 10 um square for example. At Chemical-Mechanical Planarization (CMP) process, the pattern density is a critical factor to achieve flatness and properties for a layer itself as well as other layers of above. If the size of the searching/checking window is smaller than 2 um, it will cost a lot of time in checking the semiconductor device 100. If the size of the searching/checking window is larger than 10 um, an effect of average may happen (e.g., an over density block and an under density block may combined to be qualified blocks) and the searching/checking window may contain too many polygons or blocks. If the tolerance gap is configured above 15%, the flatness of the layers of active metal interconnects aMIC and the dummy metal interconnects dMIC will be poor. A poor flatness on these layers will cause a poor uniformity of the metal interconnects and a variation on resistances of the metal interconnects.

Figure 5B:
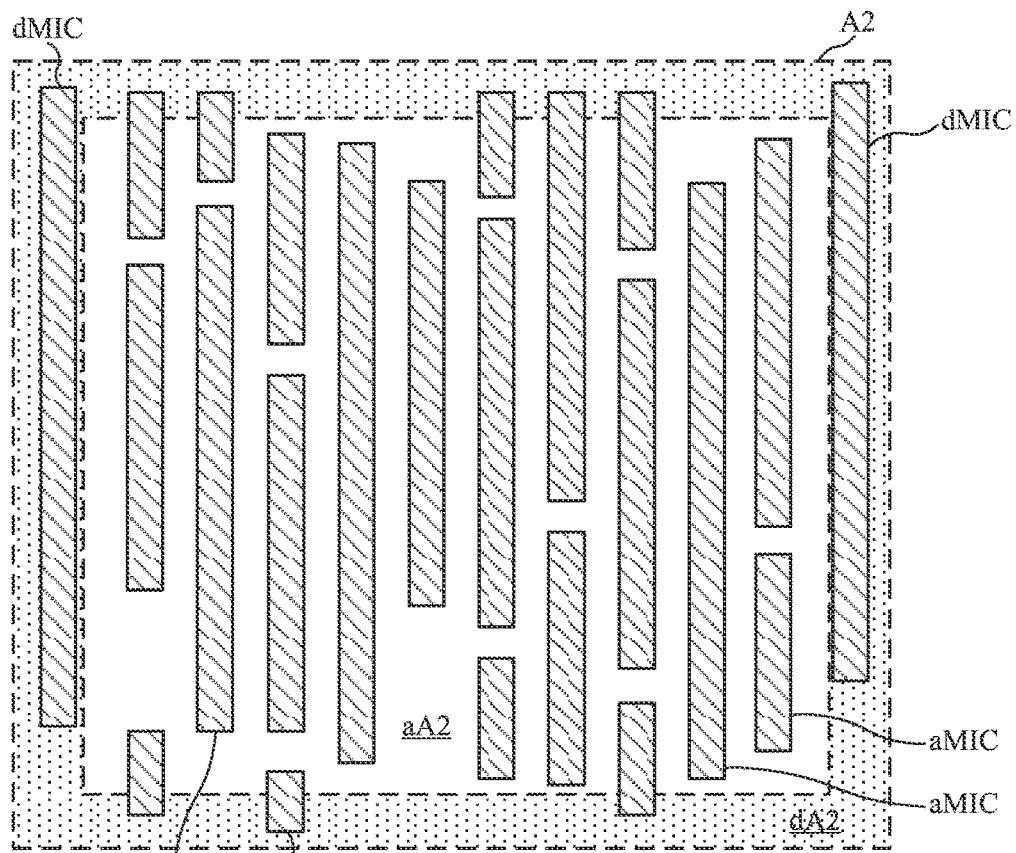
FIG. 5B is another top view diagram illustrating metal interconnects in the second area in FIG. 2 in accordance with some embodiments.

FIG. 5B is a top view diagram illustrating metal interconnects in the second area A2 in FIG. 2 in accordance with some embodiments. With respect to the embodiments of FIG. 2, like elements in FIG. 5B are designated with the same reference numbers for ease of understanding.

As illustratively shown in FIG. 5B, the second area A2 include an active region aA2 and an inactive region dA2. The active metal interconnects aMIC are disposed in the active region aA2 and the dummy metal interconnects dMIC are disposed at least a part in the inactive region dA2. In the embodiments of FIG. 5B, the active metal interconnects aMIC and the dummy metal interconnects dMIC are disposed along a vertical direction.

Figure 6A:
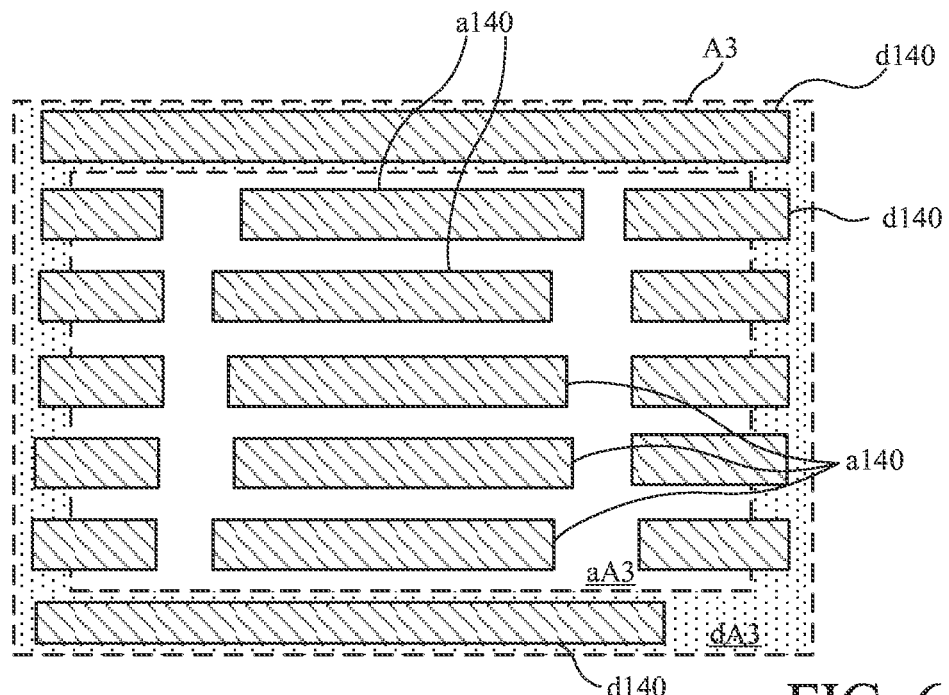
FIG. 6A is a top view diagram illustrating thin film resistors of the resistors in the third area in FIG. 2 in accordance with some embodiments.

FIG. 6A is a top view diagram illustrating thin film resistors of the resistors in the third area A3 in FIG. 2 in accordance with some embodiments. With respect to the embodiments of FIG. 2, like elements in FIG. 6A are designated with the same reference numbers for ease of understanding.

As illustratively shown in FIG. 6A, the third area A3 include an active region aA3 and an inactive region dA3. The inactive region dA3 locates around four boundary edges of the second area A3 and surrounds the active region aA3. There are several thin film resistors (including active thin film resistors a140 and dummy thin film resistors d140) formed in the third area A3. As illustratively shown in FIG. 5A, thin film resistors in the active region aA3 are the active thin film resistors a140. The active thin film resistors a140 in FIG. 6A are utilized to implement the resistor 140 as the embodiments illustrated in FIG. 1. The dummy thin film resistors d140 located at least a part in the inactive region dA3 are not utilized to form the resistor 140 in FIG. 1. In some embodiments, the dummy thin film resistors d140 are implemented to ensure flatness on the layer where the thin film resistors locate.

In the embodiments illustratively shown in FIG. 5A, the active thin film resistors a140 and the dummy thin film resistors d140 are disposed along a horizontal direction. In some embodiments illustratively shown in FIG. 6A, all of the active thin film resistors a140 are formed with an identical size, such that each one of the active thin film resistors a140 can provide an uniform resistance.

Figure 6B:
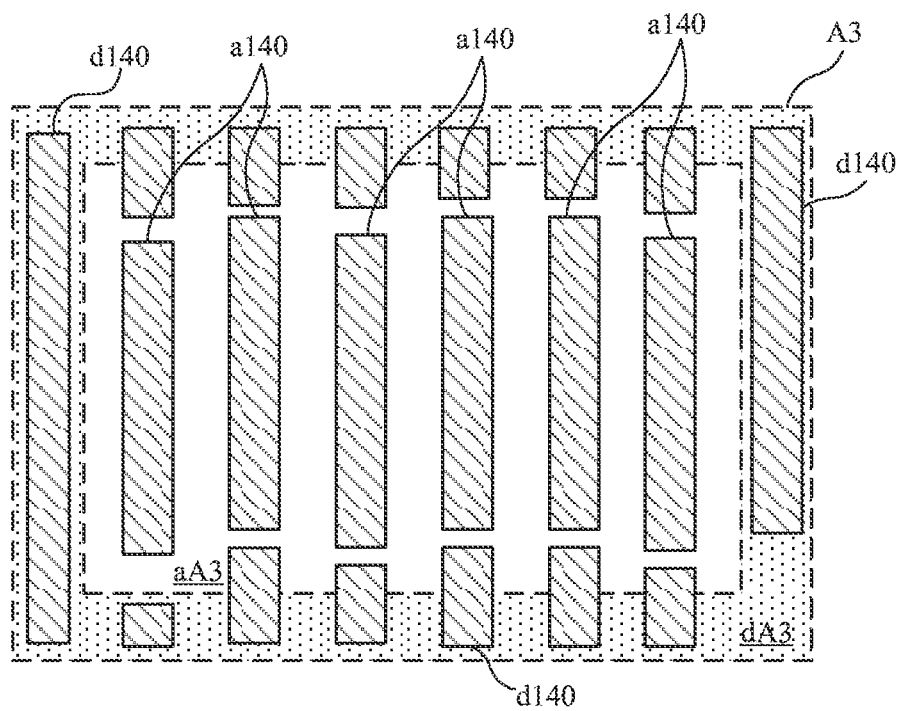
FIG. 6B is another top view diagram illustrating thin film resistors of the resistors in the third area in FIG. 2 in accordance with some embodiments.

FIG. 6B is a top view diagram illustrating thin film resistors of the resistors in the third area A3 in FIG. 2 in accordance with some embodiments. With respect to the embodiments of FIG. 2, like elements in FIG. 6B are designated with the same reference numbers for ease of understanding.

As illustratively shown in FIG. 6B, the third area A3 include an active region aA3 and an inactive region dA3. The active thin film resistors a140 are disposed in the active region aA3 and the dummy thin film resistors d140 are disposed at least a part in the inactive region dA3. In the embodiments of FIG. 6B, the active thin film resistors a140 and the dummy thin film resistors d140 are disposed along are disposed along a vertical direction.

As illustratively shown in FIG. 1, the resistor 140 is disposed between the transistor group 120 and the ground terminal GND. It is assumed that there is no resistor 140 between the transistor group 120 and the ground terminal GND, such that a system input/output (IO) voltage Vmax (between the power terminal PW and the ground terminal GND) will apply on the load 160 and the transistor group 120. In this assumption without the resistor 140, during a power-on period or a start-up period, a gate bias (Vgs) of the transistor T0 will raise dramatically to the system input/output (IO) voltage Vmax, and it will create an overshooting current over the load 160 and the transistor group 120. As illustratively shown in FIG. 1, there is the resistor 140 between the transistor group 120 and the ground terminal GND. In embodiments shown in FIG. 1, when the overshooting current flows over the resistor 140, the resistor 140 will cause a current-resistor drop (IR drop), which equals to a voltage difference Vres shown in FIG. 1, such that the gate bias (Vgs) of the transistor T0 will drop rapidly and then back to a stable voltage, which is equal to or less than a core operating voltage Vcore. In this case, the resistor 140 is able to suppress a bias temperature instability (BTI) stress on the transistor T0. The voltage difference Vres is equal to the voltage drop over/across the resistor 140. The system input/output (IO) voltage Vmax is the maximum voltage for operation of circuits, or maximum supply voltage of circuits. The core operating voltage Vcore equals to the supply voltage of circuits, when the "core device", or "thin oxide device" is used for a circuit. When a current (I) flows through the resistor 140 (R) and a core circuit (where the core operating voltage Vcore applies), the voltage difference Vres (i.e., the voltage drop on the resistor 140) equals to I*R. Therefore, when the core operating voltage Vcore reduces, the current (I) tends to increase accordingly, and the voltage difference Vres will correspondingly increase (Vres=I*R) to compensate the reduction of the core operating voltage Vcore. Therefore, in some embodiments, the voltage difference Vres can be assigned to match or compensate variations of the system input/output (IO) voltage Vmax or the core operating voltage Vcore, such that the load 160 and the transistor group 120 can operate under a stable voltage.

Figure 7:
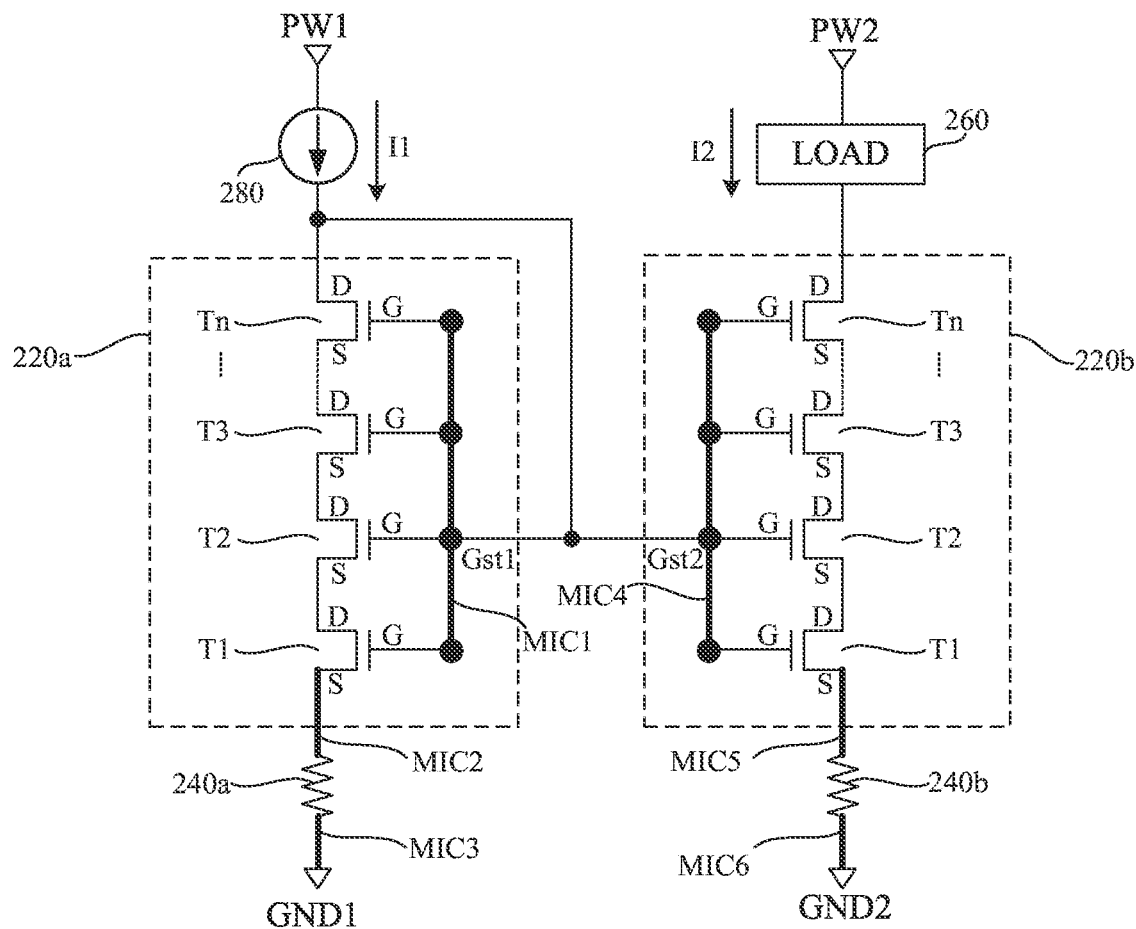
FIG. 7 is an exemplary layout diagram of a semiconductor device in accordance with various embodiments of the present disclosure.

FIG. 7 is an exemplary layout diagram of a semiconductor device in accordance with various embodiments of the present disclosure. As illustratively shown in FIG. 7, the semiconductor device 200 includes a first transistor group 220a and a second transistor group 220b, a first resistor 240a, a second resistor 240b, a load 260 and a current generator 280.

Each of the first transistor group 220a and the second transistor group 220b includes n transistors T1~Tn. In other words, the first transistor group 220a includes n transistors T1~Tn, and the second transistor group 220b includes another n transistors T1~Tn. In some embodiments, n is a positive integer lager than or equal to 3. The number of the transistors T1~Tn in the semiconductor device 200 in FIG. 7 is given for illustrative purposes. Various numbers of the transistors T1~Tn are within the contemplated scope of the present disclosure. The details in each of the first transistor group 220a and the second transistor group 220b can be referred to the transistor group 120 as disclosed in embodiments illustrated FIG. 1, FIG. 2, FIG. 3, FIG. 4A to FIG. 4D and FIG. 5A to FIG. 5B.

Examples of transistors T1~Tn include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, or planar MOS transistors with raised source/drains. The transistors T1~Tn, illustratively shown in FIG. 7, are the metal oxide semiconductor field effect transistors (MOSFETs) for illustrative purposes.

The transistors T1~Tn in the first transistor group 220a are connected in series between a first power terminal PW1 and a first ground terminal GND1. Gate terminals of the transistors T1~Tn in the first transistor group 220a are connected together by a first metal interconnect MIC1. The gate terminals of the transistors T1~Tn in the first transistor group 220a are stacked together as a stacked gate terminal Gst1. As illustratively shown in FIG. 7, the stacked gate terminal Gst1 is also connected to the first power terminal PW1 through the current generator 280. The transistors T1~Tn in the first transistor group 220a connected in series will be turned on or turned off together by a voltage level on the stacked gate Gst1. Therefore, the transistors T1~Tn in the first transistor group 220a can function as one equivalent transistor. The first metal interconnect MIC1 is located in one of metal layers, such as the first metal layer (M1), the second metal layer (M2), the third metal layer (M3), the fourth metal layer (M4), the fifth metal layer (M5) or the like, overlaid above the first transistor group 220a.

In some embodiments, each of the transistors T1~Tn in the first transistor group 220a has a similar size or about the same size. In some embodiment, each of the transistors T1~Tn in the first transistor group 220a has a gate length in a ranged from about 1 unit of minimum gate length to about 5 units of minimum gate length according to a manufacturing process standard. If each of the transistors T1~Tn in the first transistor group 220a has the gate length longer than 5 units of minimum gate length, a total size occupied by the first transistor group 220a will be too big.

As illustratively shown in FIG. 7, the first resistor 240a is connected between the first transistor group 220a and the first ground terminal GND1. More particularly, a first end of the first resistor 240a is connected to a source terminal of the transistor T1 in the first transistor group 220a by a second metal interconnect MIC2, and a second end of the first resistor 240a is connected to the first ground terminal GND1 by a third metal interconnect MIC3. The second metal interconnect MIC2 and the third metal interconnect MIC3 are located on at least one of metal layers, such as the first metal layer (M1), the second metal layer (M2), the third metal layer (M3), the fourth metal layer (M4), the fifth metal layer (M5) or the like, overlaid above the first transistor group 220a.

The transistors T1~Tn in the second transistor group 220b are connected in series between a second power terminal PW2 and a second ground terminal GND2. Gate terminals of the transistors T1~Tn in the second transistor group 220b are connected together by a fourth metal interconnect MIC4. The gate terminals of the transistors T1~Tn in the second transistor group 220b are stacked together as a stacked gate terminal Gst2. The stacked gate terminal Gst2 is connected to the stacked gate terminal Gst1 of the first transistor group 220a. The transistors T1~Tn in the second transistor group 120b connected in series will be turned on or turned off together by a voltage level on the stacked gate Gst2. Therefore, the transistors T1~Tn in the second transistor group 120b can function as one equivalent transistor. The fourth metal interconnect MIC4 is located in one of metal layers, such as the first metal layer (M1), the second metal layer (M2), the third metal layer (M3), the fourth metal layer (M4), the fifth metal layer (M5) or the like, overlaid above the second transistor group 220b.

In some embodiments, each of the transistors T1~Tn in the second transistor group 120b has a similar size or about the same size.

As illustratively shown in FIG. 7, the second resistor 240*b* is connected between the second transistor group 120*b* and the second ground terminal GND2. More particularly, a first end of the second resistor 240*b* is connected to a source terminal of the transistor T1 in the second transistor group 220*b* by a fifth metal interconnect MIC5, and a second end of the second resistor 240*b* is connected to the second ground terminal GND2 by a sixth metal interconnect MIC6. The fifth metal interconnect MIC5 and the sixth metal interconnect MIC6 are located on at least one of metal layers, such as the first metal layer (M1), the second metal layer (M2), the third metal layer (M3), the fourth metal layer (M4), the fifth metal layer (M5) or the like, overlaid above the second transistor group 220*b*. The configurations of the fourth metal interconnect MIC4, the fifth metal interconnect MIC5 and the sixth metal interconnect MIC6 can be referred to the first metal interconnect MIC1 to the third metal interconnect MIC3 shown in FIG. 2, FIG. 4A to FIG. 4D and FIG. 5A to FIG. 5B.

The first resistor 240*a* is overlaid above the first transistor group 220*a*. The first resistor 240*a* is connected between the first transistor group 220*a* and the first ground terminal GND1. Details about how to implement the first resistor 240*a* can be referred to the resistor 140 shown in FIG. 1, FIG. 2, FIG. 4A to FIG. 4D and FIG. 6A to FIG. 6B.

The second resistor 240*b* is overlaid above the second transistor group 220*b*. The second resistor 240*b* is connected between the second transistor group 220*b* and the second ground terminal GND2. Details about how to implement the second resistor 240*b* can also be referred to the resistor 140 shown in FIG. 1, FIG. 2, FIG. 4A to FIG. 4D and FIG. 6A to FIG. 6B.

As illustratively shown in FIG. 7, the current generator 280 is connected between the first power terminal PW1 and the first transistor group 220*a*. The stacked gate terminal Gst1 and the stacked gate terminal Gst2 are connected together to the current generator 280. In some embodiments, the first transistor group 220*a* and the second transistor group 220*b* together form a current mirror. The current generator 280 generates an input current I1 to the first transistor group 220*a* in the current mirror, and the current mirror will generate an output current I2 flowing through the second transistor group 220*b* and the load 260.

In an ideal case that the transistors T1~Tn in the first transistor group 220*a* in the current mirror are manufactured to have the same features (e.g., sizes, gate lengths, widths, threshold voltages, doping densities) of the transistors T1~Tn in the second transistor group 220*b* in the current mirror, the output current I2 will be identical to the input current I1. If the transistors T1~Tn in the first transistor group 220*a* fails to match the transistors T1~Tn in the second transistor group 220*b*, it will induce a current mismatch between the input current I1 and the output current I2.

It is assumed that there is no resistor between the first transistor group 120*a* and the first ground terminal GND1 and no resistor between the second transistor group 120*b* and the second ground terminal GND2, such that the output current I2 with the current mismatch will flow through the load 260 and the second transistor group 220*b*. When the transistors T1~Tn in the first transistor group 220*a* and the transistors T1~Tn in the second transistor group 220*b* are all turned on (e.g., conductive), the output current I2 will be a large current, such that the current mismatch will be correspondingly large. As illustratively shown in FIG. 7, when the first transistor group 220*a* and the transistors T1~Tn in the second transistor group 220*b* are all turned on, the first resistor 240*a* and the second resistor 240*b* are able to limit the input current I1 and the output current I2, and so as to suppress the mismatch between the input current I1 and the output current I2.

Figure 8:
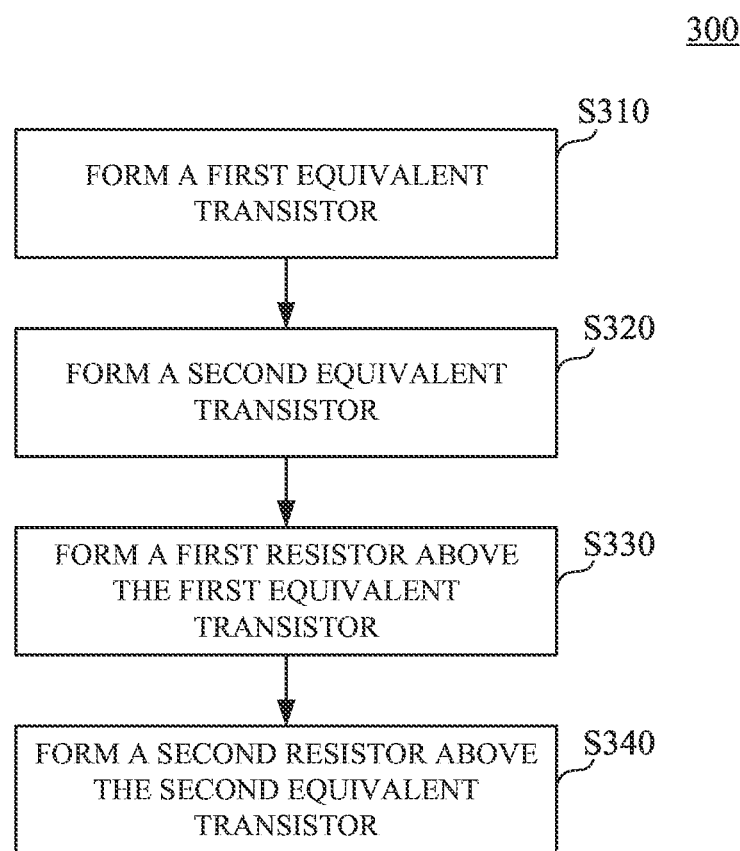
FIG. 8 is a flow chart illustrating a method for manufacturing a semiconductor device in accordance with some embodiments.

FIG. 8 is a flow chart illustrating a method 300 for manufacturing a semiconductor device in accordance with some embodiments. To aid with the understanding of the flow chart, the operations in FIG. 8 will be described with reference to FIG. 7.

Operation S310 in FIG. 8 is performed to form a first equivalent transistor (e.g., the first transistor group 220*a* in FIG. 7) by connecting transistors T1~Tn in the first transistor group 220*a* in series between the first power terminal PW1 and the first ground terminal GND1 and connecting gate terminals of the transistors T1~Tn in the first transistor group 220*a* together with the first metal interconnect MIC1 as illustrated in FIG. 7.

Operation S320 in FIG. 8 is performed to form a second equivalent transistor (e.g., the second transistor group 220*b* in FIG. 7) by connecting transistors T1~Tn in the second transistor group 220*b* in series between the second power terminal PW2 and the second ground terminal GND2 and connecting gate terminals of the transistors T1~Tn in the second transistor group 220*b* together with the fourth metal interconnect MIC4 as illustrated in FIG. 7.

Operation S330 in FIG. 8 is performed to form a first resistor 240*a* above the first equivalent transistor (e.g., the first transistor group 220*a*). The first resistor 240*a* is connected between the first equivalent transistor (e.g., the first transistor group 220*a*) and the first ground terminal GND1.

Operation S340 in FIG. 8 is performed to form a second resistor 240*b* above the second equivalent transistor (e.g., the second transistor group 220*b*). The second resistor 240*b* is connected between the second equivalent transistor (e.g., the second transistor group 220*b*) and the second ground terminal GND2.

In some embodiments, the first resistor 240*a* and the second resistor 240*b* includes at least one piece of thin film resistors. The thin film resistors can be referred to thin film resistors 140*a*, 140*b* and 140*c* in embodiments illustratively shown in FIG. 2. In some embodiments, each of the thin film resistors can be a titanium nitride (TiN) thin film resistor, and the titanium nitride (TiN) thin film resistor are manufacture-able in very-large-scale integration (VLSI) process with low variation and/or high accuracy. In other embodiments, the thin film resistors 140*a*~140*c* may be formed of other film resistor materials such as: nickel chrome (Ni—Cr) or other resistor materials.

The second metal interconnect MIC2 is formed to connect a source terminal of one of the transistor T1 in the first transistor group 220*a* to a first end of the first resistor 240*a*. The third metal interconnect MIC3 is formed to connect a second end of the first resistor 240*a* to the first ground terminal GND1.

The fifth metal interconnect MIC5 is formed to connect a source terminal of one of the transistor T1 in the second transistor group 220*b* to a first end of the second resistor 240*b*. The sixth metal interconnect MIC6 is formed to connect a second end of the second resistor 240*b* to the second ground terminal GND2.

The method 300 in FIG. 8 is utilized to manufacture a current mirror as illustrated in FIG. 7. The current mirror includes thin film resistors disposed between source terminals and ground terminals. The thin film resistors are beneficial to suppress a current mismatch between an input current I1 and an output current I2 of the current mirror.

In some embodiments, the current mirror in the semiconductor device 200 shown in FIG. 7 and formed by the method 300 shown in FIG. 8 can be utilized in a digital-to-analog converter (DAC), a phase-locked loop circuit, a memory interface circuit, a high speed interface (e.g., USB type C interface), a thermal sensor, a voltage regulator or any analog circuit requiring a steady current source.

The thin film resistors of the first resistor 240a and the second resistor 240b are disposed above the first transistor group 220a and the second transistor group 220b, such that the thin film resistors of the first resistor 240a and the second resistor 240b will not occupy extra area outside the area for accommodating the transistor groups 220a and 220b on a layout of the semiconductor device. The area for accommodating the first resistor 240a and the second resistor 240b totally fall within the area for accommodating the transistors group 120. In other words, forming the resistor 140 overlaid over the first transistor group 220a and the second transistor group 220b can reduce a consumption of area resource in the layout design.

In applications of the digital-to-analog converter (DAC), the current mirrors disposed in the digital-to-analog converter (DAC) are required to have a low level of current mismatch to ensure the preciseness of the digital-to-analog converter (DAC). In order to achieve the same level of current mismatch, if the current mirror is implemented by one singular large-sized transistor as the first transistor group 220a and another large-sized transistor as the second transistor group 220b, these two transistors will occupy a much larger area. Compared to implement the first transistor group 220a and the second transistor group 220b with two large-sized transistors, because each of the transistors T1~Tn in the semiconductor device 200 shown in FIG. 7 are far smaller, the semiconductor device 200 with the stacked the transistors T1~Tn can have about 75% reduction of layout area at 16 nanometers technology node. As for 3 nanometers or 5 nanometers technology nodes, the stacked the transistors T1~Tn in the semiconductor device 200 can be even smaller, such that the semiconductor device 200 in embodiments shown in FIG. 7 with the stacked the transistors T1~Tn can save more layout area.

In some embodiments, a semiconductor device includes a plurality of transistors, a plurality of metal layers, and a resistor. The plurality of transistors are connected in series between a power terminal and a ground terminal, and gate terminals of the transistors being connected together. The plurality of metal layers are overlaid above the plurality of transistors. The resistor is implemented between two of the plurality of metal layers.

In some embodiments, the semiconductor device further includes a first metal interconnect. The first metal interconnect connects the gate terminals of plurality of the transistors together.

In some embodiments, the first metal interconnect is located on at least one of the plurality of metal layers.

In some embodiments, the semiconductor device further includes a second metal interconnect. The second metal interconnect connects a source terminal of one of the transistors to a first end of the resistor.

In some embodiments, the second metal interconnect is located on at least one of the plurality of metal layers.

In some embodiments, the semiconductor device further includes a third metal interconnect. The third metal interconnect connects a second end of the resistor to the ground terminal.

In some embodiments, the third metal interconnect is located on at least one of the plurality of metal layers.

In some embodiments, the transistors are formed within a first area, and the resistor is formed in a second area overlapping with the first area.

In some embodiments, the second area is smaller than the first area.

In some embodiments, the resistor includes a Titanium Nitride thin film resistor.

In some embodiments, a semiconductor device includes a first transistor, a second transistor, a first thin film resistor, and a second thin film resistor. Gate terminals of the first transistor and the second transistor are connected together. The first thin film resistor is implemented between two adjacent layers of a plurality of layers overlaid above the first transistor and the second transistor. The second thin film resistor is implemented between the two adjacent layers.

In some embodiments, the first thin film resistor and the second thin film resistor comprise Titanium Nitride thin film resistors.

In some embodiments, the semiconductor device further includes a first metal interconnect. The first metal interconnect connects the gate terminals of the first transistor and the second transistor.

In some embodiments, the semiconductor device further includes a second metal interconnect. The second metal interconnect connects a source terminal of the first transistor to a first end of a resistor. The resistor comprises the first thin film resistor and the second thin film resistor.

In some embodiments, the semiconductor device further includes a third metal interconnect. The third metal interconnect connects a second end of the resistor to a ground terminal.

In some embodiments, the two adjacent layers are metal interconnect layers.

In some embodiments, the two adjacent layers are a top metal layer and a bond pad layer.

In some embodiments, a semiconductor device includes a plurality of transistors, a first metal interconnect, a second metal interconnect, a third metal interconnect, and a resistor. The plurality of transistors are connected in series. The first metal interconnect connects gate terminals of the plurality of transistors together. The second metal interconnect connects the plurality of transistors. The third metal interconnect connects a ground terminal. The resistor is connected between the second metal interconnect and the third metal interconnect.

In some embodiments, the plurality of transistors are implemented in a first area. The first metal interconnect, the second metal interconnect, and the third metal interconnect are implemented in a second area. The resistor is implemented in a third area.

In some embodiments, a size of the third area is smaller than sizes of the first area and the second area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first transistor;
    a second transistor, wherein gate terminals of the first transistor and the second transistor are connected together;
    a first thin film resistor implemented between two adjacent layers of a plurality of layers overlaid above the first transistor and the second transistor; and
    a second thin film resistor implemented between the two adjacent layers.

2. The semiconductor device of claim 1, wherein the first thin film resistor and the second thin film resistor comprise Titanium Nitride thin film resistors.

3. The semiconductor device of claim 1, further comprising:
    a first metal interconnect, wherein the first metal interconnect connects the gate terminals of the first transistor and the second transistor.

4. The semiconductor device of claim 3, further comprising:
    a second metal interconnect, wherein the second metal interconnect connects a source terminal of the first transistor to a first end of a resistor, wherein the resistor comprises the first thin film resistor and the second thin film resistor.

5. The semiconductor device of claim 4, further comprising:
    a third metal interconnect, wherein the third metal interconnect connects a second end of the resistor to a ground terminal.

6. The semiconductor device of claim 1, wherein the two adjacent layers are metal interconnect layers.

7. The semiconductor device of claim 1, wherein the two adjacent layers are a top metal layer and a bond pad layer.

8. A semiconductor device, comprising:
    a transistor group implemented in a first area, wherein gate terminals of a plurality of transistors in the transistor group are connected together;
    a plurality of metal layers overlaid above the transistor group; and
    a plurality of thin film resistors implemented in a second area and between two of the plurality of metal layers, wherein the second area is smaller than the first area.

9. The semiconductor device of claim 8, wherein the plurality of thin film resistors comprise a first thin film resistor and a second thin film resistor, and the first thin film resistor and the second thin film resistor comprise Titanium Nitride thin film resistors.

10. The semiconductor device of claim 8, further comprising:
    a first metal interconnect, wherein the first metal interconnect connects the gate terminals.

11. The semiconductor device of claim 10, further comprising:
    a second metal interconnect, wherein the second metal interconnect connects a source terminal of one of the plurality of transistors in the transistor group to a first end of a resistor, wherein the resistor comprises the plurality of thin film resistors.

12. The semiconductor device of claim 11, further comprising:
    a third metal interconnect, wherein the third metal interconnect connects a second end of the resistor to a ground terminal.

13. The semiconductor device of claim 12, wherein the first metal interconnect, the second metal interconnect, and the third metal interconnect are implemented in a third area, wherein the second area is smaller than the third area.

14. The semiconductor device of claim 8, wherein the two of the plurality of metal layers comprise a first metal layer and a second metal layer, wherein the second metal layer is adjacent to the first metal layer, and the first metal layer is adjacent to the transistor group.

15. A semiconductor device, comprising:
    a transistor group, wherein gate terminals of a plurality of transistors in the transistor group are connected together;
    a plurality of metal interconnects overlaid above the transistor group
    a top metal layer overlaid above the transistor group;
    a bond pad layer overlaid above the top metal layer; and
    a plurality of thin film resistors between the top metal layer and the bond pad layer.

16. The semiconductor device of claim 15, wherein the plurality of thin film resistors comprise a first thin film resistor and a second thin film resistor, and the first thin film resistor and the second thin film resistor comprise Titanium Nitride thin film resistors.

17. The semiconductor device of claim 16, wherein the plurality of metal interconnects comprise:
    a first metal interconnect, wherein the first metal interconnect connects the gate terminals.

18. The semiconductor device of claim 17, wherein the plurality of metal interconnects further comprise:
    a second metal interconnect, wherein the second metal interconnect connects a source terminal of one of the plurality of transistors in the transistor group to a first end of a resistor, wherein the resistor comprises the plurality of thin film resistors.

19. The semiconductor device of claim 18, wherein the plurality of metal interconnects further comprise:
    a third metal interconnect, wherein the third metal interconnect connects a second end of the resistor to a ground terminal.

20. The semiconductor device of claim 19, wherein the first metal interconnect, the second metal interconnect, and the third metal interconnect are implemented in a first area, wherein the plurality of thin film resistors are implemented in a second area, wherein the second area is smaller than the first area.

* * * * *